United States Patent [19]

Jannotta

[11] 4,342,996

[45] Aug. 3, 1982

[54] TWO DISC ENCODER SYSTEM FOR MONITORING HEIGHT OF LIQUID IN STORAGE TANK

[76] Inventor: Louis J. Jannotta, 2800 Bernice Rd., Lansing, Ill. 60438

[21] Appl. No.: 201,805

[22] Filed: Oct. 29, 1980

[51] Int. Cl.³ .................. G08C 19/16; G08C 9/06
[52] U.S. Cl. .................. 340/870.16; 250/570; 340/870.11
[58] Field of Search .................. 340/870.16, 870.29, 340/870.11, 619, 623; 250/570, 357; 73/308, 292, 290 R

[56] References Cited

U.S. PATENT DOCUMENTS

| | | | |
|---|---|---|---|
| 3,725,904 | 4/1973 | Breslow et al. | 250/570 |
| 3,908,129 | 9/1975 | Akers | 250/357 |
| 3,956,681 | 5/1976 | Vail et al. | 250/570 |
| 3,975,633 | 8/1976 | Larkin | 250/570 |
| 4,236,144 | 11/1980 | Sunagana | 340/870.11 |

Primary Examiner—Glen R. Swann, III

[57] ABSTRACT

An apparatus for determining the height of liquid in a storage tank comprising: an instrument shaft capable of being associated with the shaft of the tank level gage; a first disc rotatable in response to the rotation of the instrument shaft; a second disc rotatable in response to the rotation of the first disc; first and second signal emitters associated with the first and second discs, respectively; and first and second signal receivers associated with the first and second signal emitters, respectively. A different, distinct pattern of signals is received by each of the receivers for each radial increment of disc as each disc rotates. The patterns of signals received by the first and second receivers are translatable into the height of liquid in the tank.

16 Claims, 9 Drawing Figures

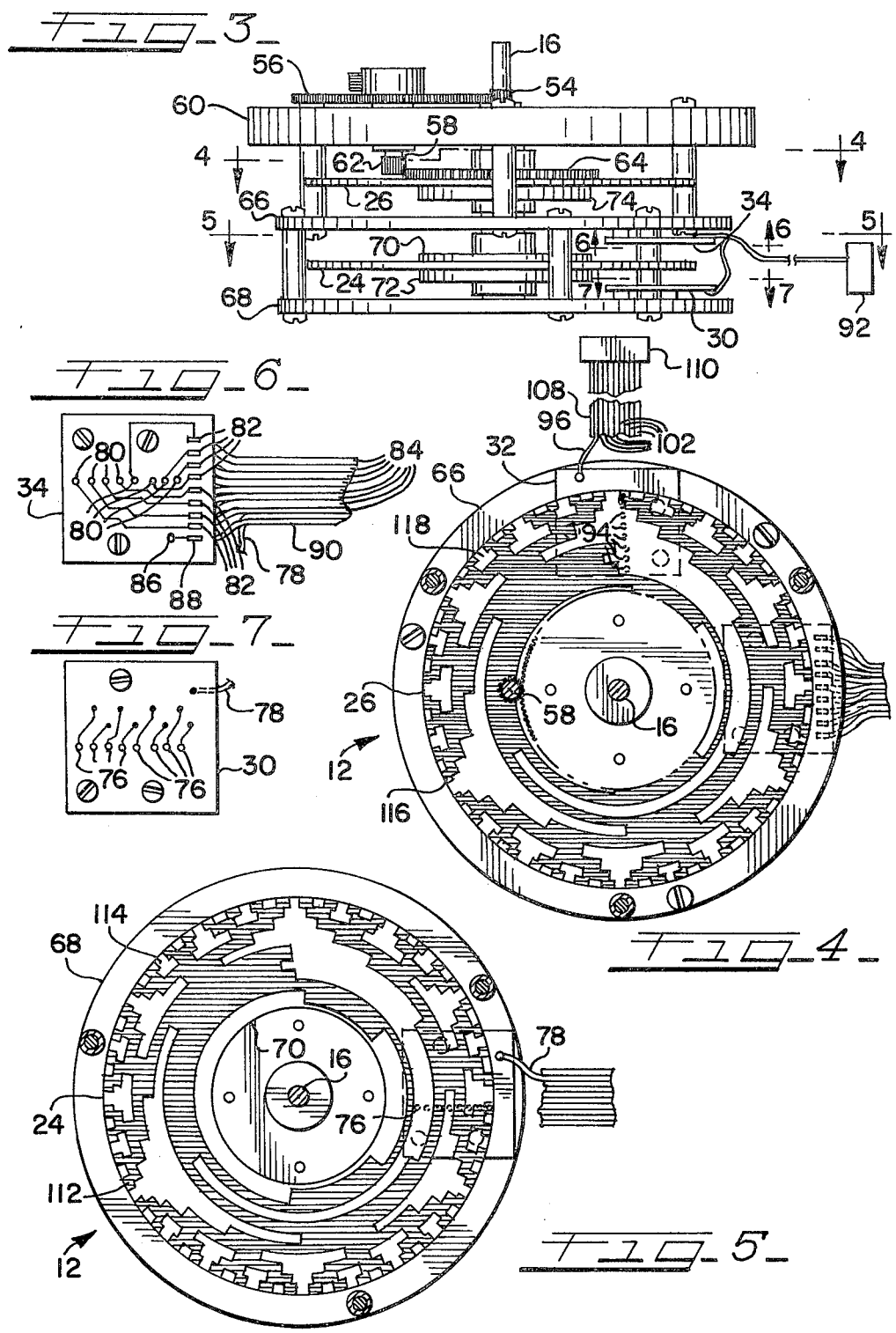

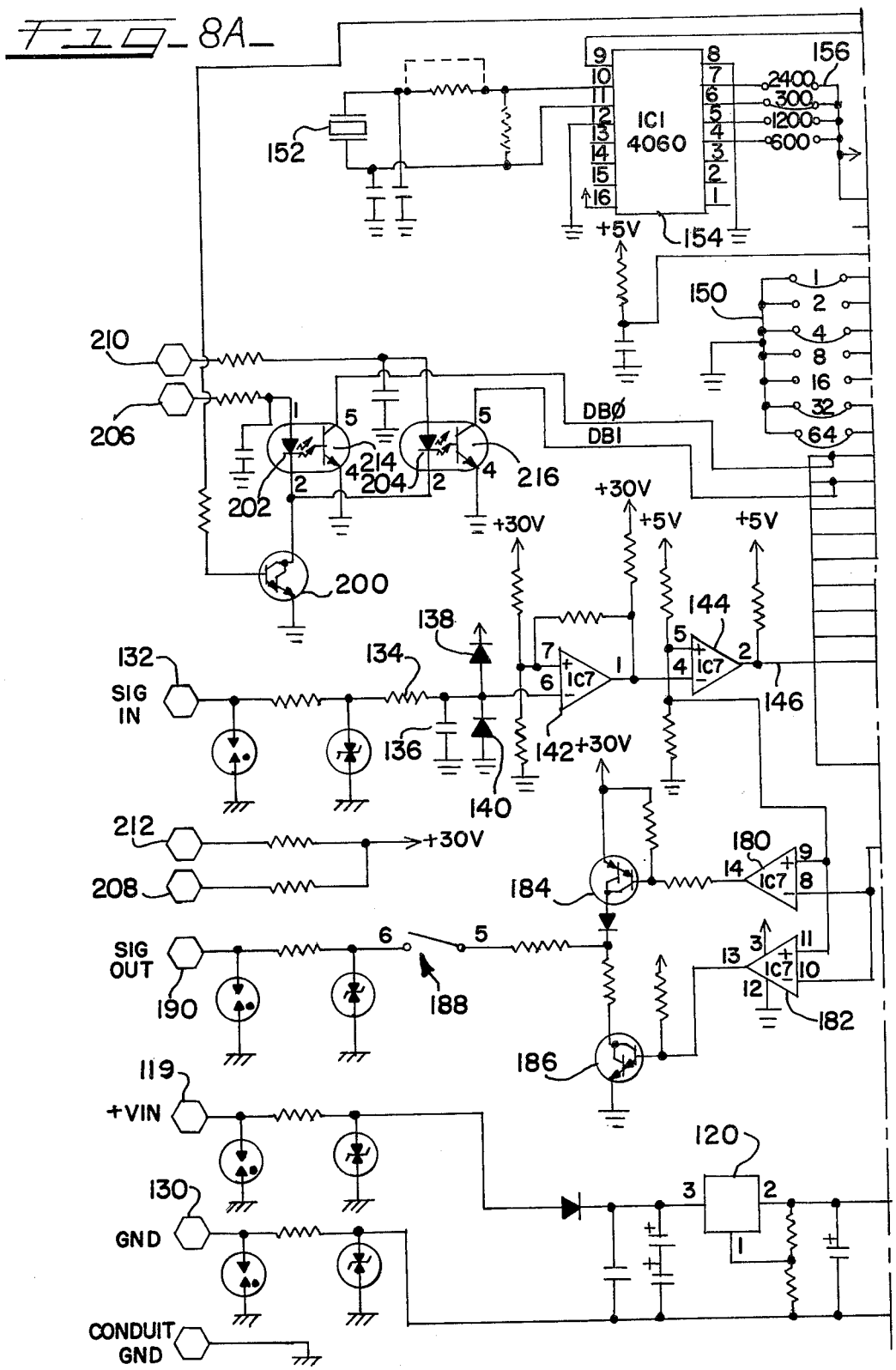
FIG_8A_

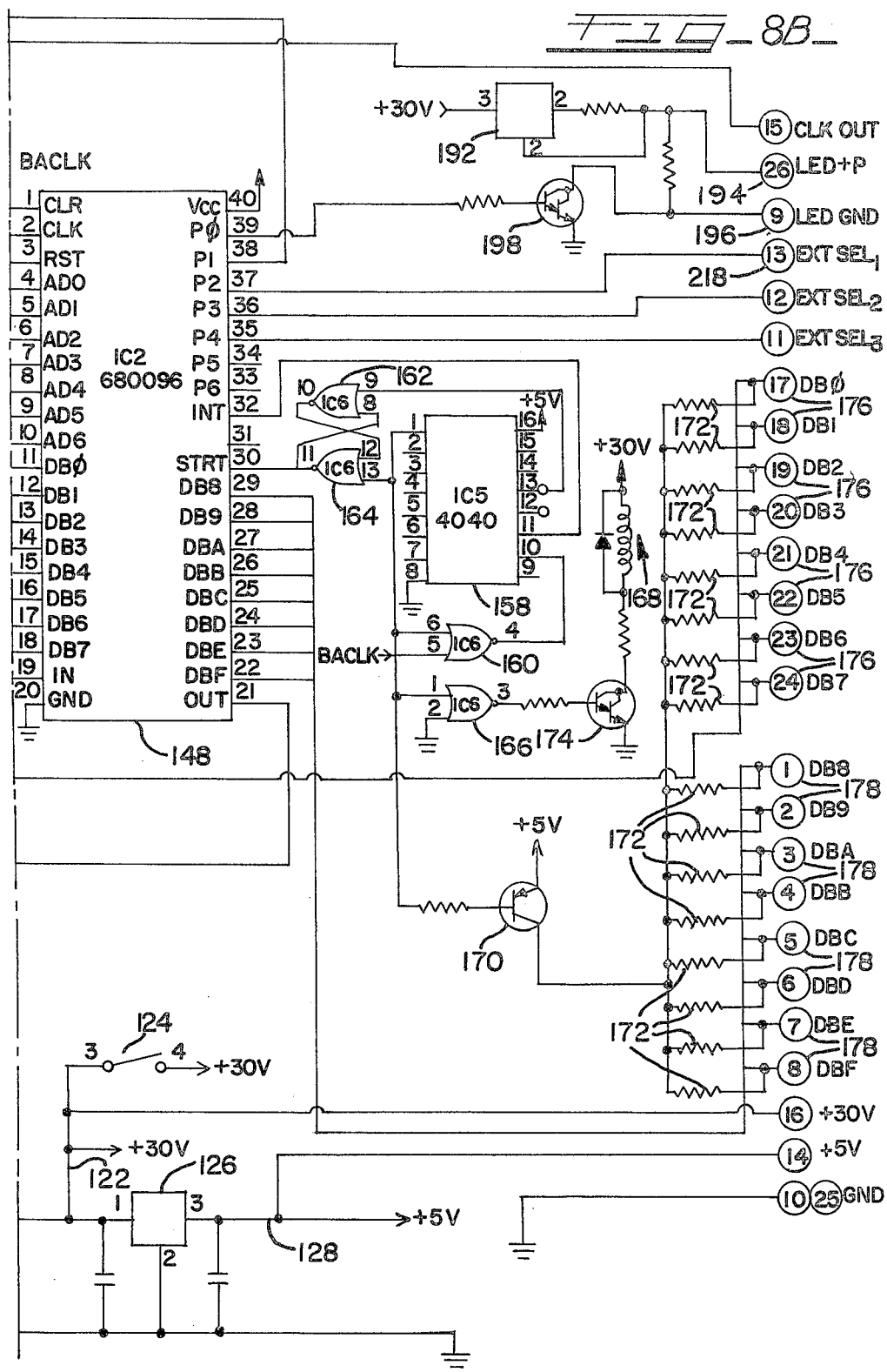

TWO DISC ENCODER SYSTEM FOR MONITORING HEIGHT OF LIQUID IN STORAGE TANK

BACKGROUND OF THE INVENTION

This invention relates to an encoder-transmitter useful in monitoring the height of liquid in a liquid storage tank. More particularly, the invention relates to such an encoder-transmitter which utilizes patterns of signals which are translatable into the absolute height of liquid over at least a portion of the total height of the tank.

The height of liquid in a storage tank is conventionally determined using a float-type mechanical gage. The float, which moves up and down in response to changes in liquid height, is attached to a gage shaft which rotates in response to the movement of the float. Thus, by calibrating the rotational position of the gage shaft with various heights of liquid, the liquid height at any given time can be determined by observing the rotational position of the gage shaft.

In many situations, liquid heights in a great many tanks, e.g., 50 to 100 or more tanks, need to be determined or monitored at the same time. Therefore, it is desirable to provide an encoder-transmitter for liquid height information from individual storage tank gages so that such information can be transmitted to a central receiving or monitoring station.

Various shaft position monitoring systems have been suggested in the prior art. Examples of such systems are disclosed in the following U.S. Pat. Nos. 4,137,451; 4,086,580; 4,037,219; 3,959,628; 3,875,406; 3,842,268; 3,808,431; 3,525,094; and 3,328,591.

Many of these prior art devices are not concerned with monitoring liquid heights in storage tanks. These previous transmitters have only a relatively limited degree of accuracy; require a relatively large amount of energy during use and/or may be unsafe, especially when used in conjunction with tanks used to store flammable liquids such as certain hydrocarbons. One additional problem with certain of the prior systems is the need for recalibration, e.g., between the gage and transmitter, each time the transmitter inadvertently lost track of the position of the gage shaft, e.g., during temporary power outages. This problem could involve substantial manpower requirements for recalibration. Also, since it may not be apparent that the transmitter has lost track of the position of the gage shaft, e.g., as the result of very short power outages, such systems may provide inaccurate liquid height information.

SUMMARY OF THE INVENTION

Therefore, one object of the present invention is to provide an improved apparatus for monitoring the height of liquid in a liquid storage tank.

Another object of this invention is to provide such a monitoring apparatus having improved accuracy with regard to the height of the liquid.

A further object of this invention is to provide such a monitoring apparatus which uses a reduced amount of energy.

An additional object of this invention is to provide such a monitoring apparatus having improved safety, e.g., when used in conjunction with tanks storing flammable liquids.

A still further object of this invention is to provide such a monitoring apparatus having improved reliability. Other objects and advantages of the present invention will become apparent hereinafter.

An improved apparatus for monitoring (and transmitting) the height of liquid is a liquid storage tank has now been discovered. This system is useful in conjunction with a storage tank which is equipped with a height (or level) gage including a gage shaft which is rotatable in response to changes in the height (or level) of the liquid in the tank.

In one embodiment, the present apparatus involves an instrument shaft means which is capable of being associated with the gage so as to be rotatable in response to the rotation of the gage shaft. A first coded disc means associated with the instrument shaft means is provided which is rotatable in response, preferably in direct response, to the rotation of the instrument shaft means. A second coded shaft means is provided which is associated with, and rotatable in response to, the rotation of the first coded disc means. First and second signal emitting means are provided which comprise a plurality of distinct first and second signal sources, respectively, located relative to the first and second coded disc means, respectfully, so as to be capable of emitting signals through the first and second coded disc means, respectively, at least during one or more portions of a full revolution of the coded disc means. First signal receiving means is included and comprises a plurality of distinct first signal detectors located so as to be capable of detecting signals from the first signal emitting means that pass through the first coded disc means. Similarly, a second signal receiving means is provided which includes a plurality of distinct second signal detectors located to be capable of detecting signals from the second signal emitting means that pass through the second coded disc means.

The first and second signal receiving means receive a different, distinct pattern of signals from the first and second signal emitting means, respectively, for each radial increment of first and second coded disc means, respectively, as the disc means rotate. These different, distinct patterns of signals received by the first and second signal receiving means are translatable into the absolute height of liquid in the storage tank over at least a portion of the total height, preferably over substantially the entire working height, of the tank.

The present apparatus, as described above, provides substantial benefits. For example, the combination of two discs cooperating as noted above allows the present system to monitor, without recalibration, the liquid height in the tank even in the event of equipment breakdown such as power outages, other temporary signal disturbances and the like. After the equipment breakdown is repaired, the present system, without recalibration, is again capable of transmitting information representing the absolute height of liquid in the tank.

In one preferred embodiment, the present transmitter apparatus further comprises signal processing means which is associated with both first and second signal receiving means. This signal processing means collects information as to the presence or absence of a signal from each of the distinct first and second signal detectors. This information is processed for sequential transmission, as desired. More preferably, the signal processing means is capable of further acting to sequentially transmit information from the first and second receiver means in response to signals from a separate receiver. For example, such information from a plurality of the present transmitters (associated with, for example, a "tank farm") may be requested by and sent to a central monitoring station, such as described in U.S. patent application Ser. No. 058,508 (1970 Series) of Louis J. Jannotta, filed July 18, 1979, now U.S. Pat. No. 4,275,382, the specification of which is hereby incorporated herein by reference.

Preferably, the signals emitted from the first and second signal sources are light signals, more preferably infrared light signals. Preferably, the number of first signal sources equals the number of first signal detectors and the number of second signal sources equals the number of second signal detectors.

Substantial advantages are obtained when the first and second signal sources are conventional, commercially available light, more preferably infrared light, emitting diodes and the first and second signal detectors are conventional, commercially available phototransistors. The use of such light emitting diodes and phototransistors provides a signficant improvement in transmitter accuracy. Each diode is preferably paired with a single phototransistor so that the phototransistor is capable of detecting a signal (light) from only its paired diode. This one-to-one relationship minimizes monitoring or transmission inaccuracies caused by signal detectors picking out extraneous signals. The use of light emitting diodes in this application provides additional benefits. These diodes consume substantially less energy than light sources previously suggested. The use of infrared light emitting diodes (and corresponding phototransistors) has the further advantage of reduced sensitivity to extraneous, e.g., visible, light. Further, light emitting diodes and phototransistors provide improved safety, in particular when used to monitor the liquid height in a storage tank containing flammable liquid.

With regard to the first and second coded disc means, it is preferred that such components include opaque areas, i.e., areas which are opaque to the transmission of signals (e.g., infrared light) through the first or second coded disc means, and clear or transparent areas, i.e., areas which allow the transmission of such signals through the first or second coded disc means. Preferably, the opaque and clear areas are present on both the coded disc means in a series of concentric, circular arrays such that only one of such areas changes from opaque to clear (or vice versa) from one radial increment of the disc means to the adjacent radial increment of such disc means.

Both first and second coded disc means are preferably rotatable continuously through a full three hundred sixty degrees (360°) without losing calibration. This preferred feature of the present invention allows for improved initial calibration of the present apparatus. For example, the remote receiver, to which signal pattern information is transmitted, may be provided with the actual level of liquid in the storage tank. The receiver, which also has information to convert individual signal pattern information into liquid heights or levels, derives a correction factor to adjust any inconsistency between the actual level and the signal pattern information transmitted to it. In short, in this preferred embodiment, the present apparatus need not be initially calibrated exactly in order to transmit signal pattern information which is translatable into the absolute level of liquid in a storage tank.

The signal sources and detectors are preferably positioned and paired so that the detector of each source-detector pair monitors the presence or absence of a signal through a single circular array of opaque and clear areas as the coded disc means rotates. The signal detectors, in combination, of the source-detector pairs receive a pattern of signals which is characteristic of a specific radial increment of the coded disc means. To illustrate, one particularly preferred embodiment involves eight (8) circular arrays of opaque-clear areas, disc means divided into one hundred ninety two (192) radial increments and eight (8) pairs of infrared light emitting diodes and phototransistors. The number "1" indicates that a given phototransistor receives a signal (indicating a clear area) and the number "0" indicates that a given phototransistor receives no signal (indicating an opaque area). For three adjacent radial increments of a coded disc means the phototransistors receive the following patterns of signals:

| Radial Increment | Phototransistor | | | | | | | |
|---|---|---|---|---|---|---|---|---|
| | 1 | 2 | 3 | 4 | 5 | 6 | 7 | 8 |
| A | 0 | 0 | 1 | 0 | 0 | 1 | 0 | 1 |
| B | 0 | 1 | 1 | 0 | 0 | 1 | 0 | 1 |
| C | 1 | 1 | 1 | 0 | 0 | 1 | 0 | 1 |

As shown, only one area changes from opaque to clear as you move from radial increment A to B and then from B to C. These patterns of signals can be binary coded for ease in translation into the absolute height of liguid in a storage tank. In order to minimize coding complexities, it is preferred that the configuration with respect to opaque and clear areas of both first and second coded disc means be identical. The opaque and clear areas are preferably positioned on both first and second coded disc means in a conventional gray code array or modified gray code array to provide that only one area changes from opaque to clear (or vice versa) from one radial increment of the disc means to an adjacent radial increment.

Further, with regard to the signal processing means, which preferably includes one or more commercially available integrated circuits and associated electrical and electronic components, such means preferably is additionally capable of receiving alarm information from a level sensor associated with the storage tank. Such alarm information, indicating an undesirably high level of liquid in the tank, is capable of being transmitted by the signal processing means to a separate receiver means. Also, the signal processing means is preferably further capable of receiving liquid temperature information from a temperature sensor associated with the storage tank. In this instance, the signal processing means is further capable of transmitting this temperature information to a separate receiver means.

An additional preferred embodiment provides that the signal process means enables, e.g., controls the power to, the first and second signal emitting means, and first and second signal receiving means as desired, for example so that signals are emitted from and received by the signal emitting means and the signal receiving means, respectively, only when liquid level information is being transmitted, e.g., to a remote receiver. This preferred feature of the present invention allows further reductions in power consumption, in particular when each of the signal emitting means comprise light emitting diodes and each of the signal receiving means comprise phototransistors.

BRIEF DESCRIPTION OF THE DRAWINGS

These and other aspects and advantages of the present invention are set forth in the following detailed description and claims, particularly when considered in conjunction with the accompanying drawings in which like parts bear like reference numerals. In the drawings:

FIG. 3 is a side plan view taken along line 3—3 in FIG. 2.

FIG. 4 is an elevation view taken along line 4—4 in FIG. 3.

FIG. 5 is an elevation view taken along line 5—5 in FIG. 3.

FIG. 6 is a plan view taken along line 6—6 in FIG. 3.

FIG. 7 is a plan view taken along line 7—7 in FIG. 3.

FIGS. 8A and 8B together are a circuit diagram (with a common center line) illustrating the data transmission board of the embodiment shown in FIG. 1.

DESCRIPTION OF THE PREFERRED EMBODIMENTS

Figure 1:
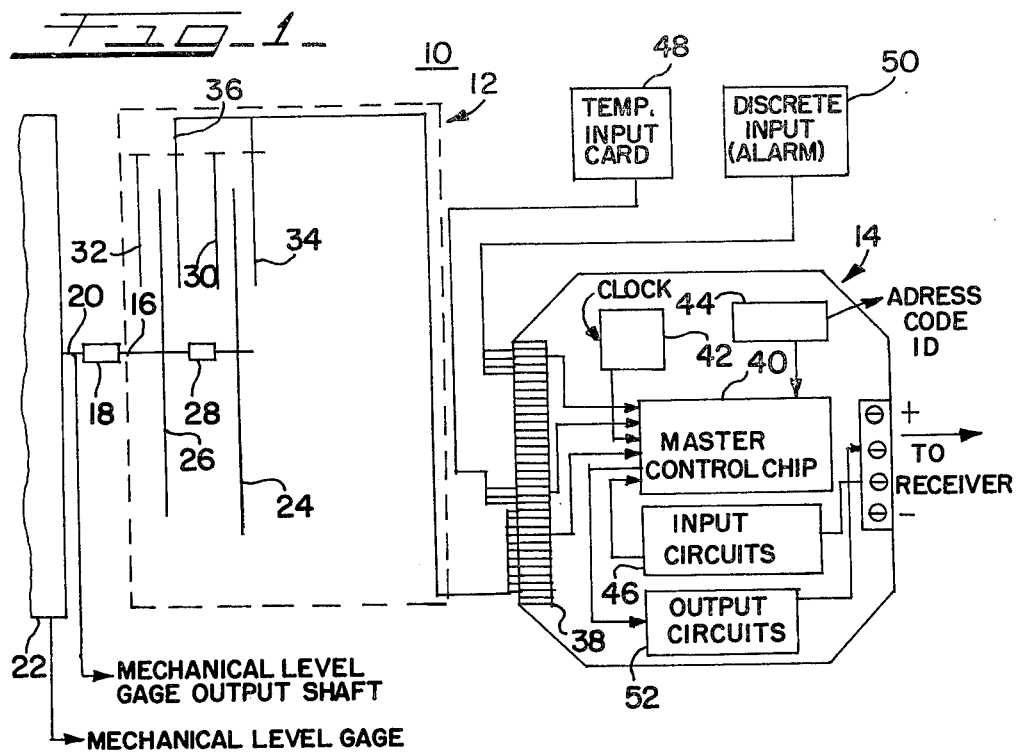
FIG. 1 is a schematic illustration of one embodiment of the present apparatus.
Figure 2:
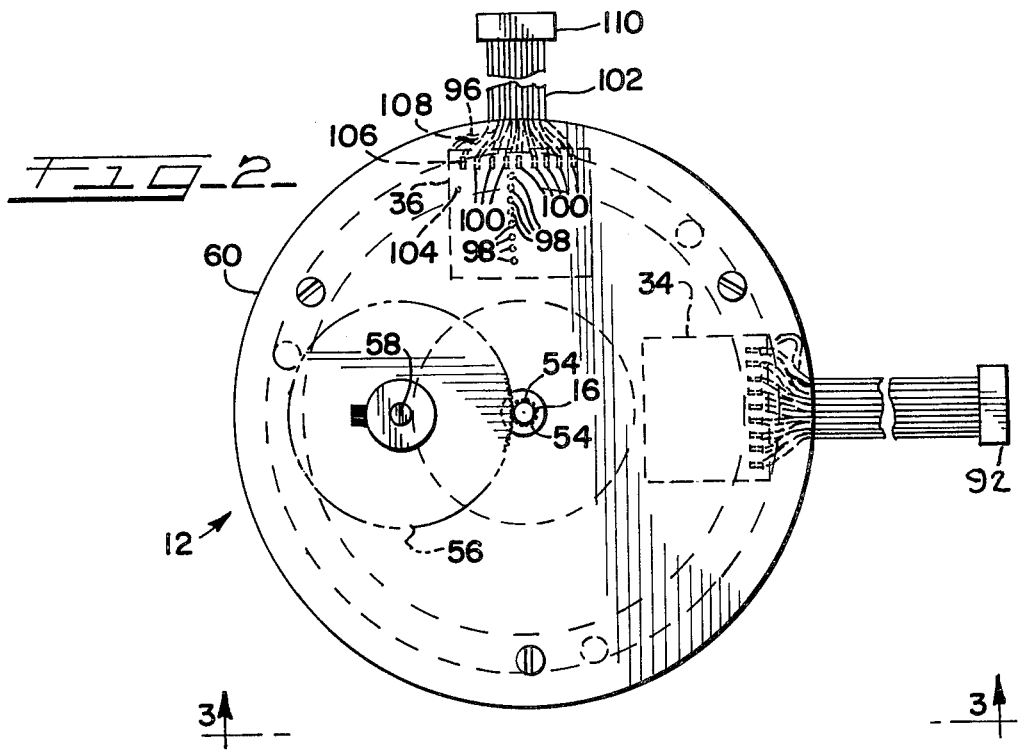
FIG. 2 is a top elevation view of the encoder biscuit of the embodiment illustrated in FIG. 1.

In the drawings, and in particular FIG. 1, the present encoder-transmitter, shown generally at 10, includes an encoder biscuit 12 linked together with a data transmission board 14. The components making up encoder-biscuit 12 and data transmission board 14 will be described in detail hereinafter. However, FIG. 1 provides a general overview of the functioning of encoder-transmitter 10.

Referring now to FIG. 1, encoder biscuit 12 includes an input shaft 16 which is connected by conventional connector 18 to the output shaft 20 of conventional mechanical level gage 22. This gage 22 is associated with a liquid storage tank (not shown) and monitors the level or height of the liquid therein.

Input shaft 16 is directly linked with first coded disc 24 so that first coded disc 24 rotates in direct response to the rotation of input shaft 16. That is, there is a one-to-one relationship between the rotational movement of input shaft 16 and the rotational movement of first coded disc 24. Second coded disc 26 is linked to input shaft 16 via gear assembly 28 so that second coded disc 26 makes one complete rotation for every ninety six (96) complete rotations of input shaft 16 and first coded disc 24.

First light emitter 30 and second light emitter 32 are associated with first and second coded discs 24 and 26, respectively, and are capable of passing infrared light signals through the clear areas (to be described in detail hereinafter) of first and second coded discs, respectively. First light receiver 34 and second light receiver 36 are associated with first and second light emitters 30 and 32, respectively, and act to detect the pattern of light signals from first and second light emitters 30 and 32, respectively, which pass through first and second coded discs 24 and 26. The term "pattern of signals" or "pattern of light signals" as used herein means the sequence of indications as to the presence or absence of signals (e.g., infrared light signals) identified by a plurality of signal detectors which are included in the present signal receiving means, e.g., both first and second light receivers 34 and 36. One possible "pattern of signals" can be the total absence of signals received by the signal detectors of first and/or second signal receiving means.

A distinct and different pattern of light signals is received by first light receiver 34 for each radial increment of first coded disc 24 which passes between (because of rotation of first coded disc 24) first light emitter 30 and first light receiver 34. Similarly, a distinct and different pattern of light signals is received by second light receiver 36 for each radial increment of second coded disc 26 which passes between (because of rotation of second coded disc 26) second light emitter 32 and second light receiver 36. Thus, these patterns of light signals received by first and second light receivers 34 and 36 can be translated to determine the rotational position of both first and second coded discs 24 and 26. Since the rotations of first and second coded discs 24 and 26 are linked to mechanical level gage 22 (as described above) which monitors the level of liquid is the storage tank, the light pattern information received by first and second light receivers 34 and 36 are translatable into the absolute height or level of liquid in the storage tank.

As shown schematically in FIG. 1, the light pattern information from first and second light receivers 34 and 36 is passed to data transmission board 14 and input into grid 38 for further processing. The basic function of data transmission board 14 is to process this light pattern information for transmission, upon request, to a receiver or central monitoring station where the liquid level or height in the particular storage tank under consideration is monitored and/or recorded. Communication between the central monitoring station and data transmission board 14 may take place in any suitable manner and format. For example, such communication may be as disclosed in U.S. patent application Ser. No. 058,508 (1970 Series), now U.S. Pat. No. 4,275,382, the specification of which has been incorporated herein by reference. In view of the above, a detailed description of such communication is not deemed necessary and is not included herein.

In any event, the light pattern information from grid 38 is passed to master control chip 40 for processing to enable this information to be transmitted to the receiver. Master control chip also receives inputs from timer 42, which acts to control the internal timing within data transmission board 14 to insure effective communication with and data transmission to the receiver; from address code indicator 44, which includes information to identify the particular tank with which encoder-transmitter 10 is associated; and from input circuits 46 which condition the signals received from the receiver prior to transmission to master control chip 40. Master control chip 40 also receives, via grid 38, information regarding the temperature of the liquid in the tank from a temperature input card 48 (which may be associated with a conventional temperature sensor located within the tank); and information regarding high liquid levels in the tank from a level alarm indicator 50 (which may be associated with a conventional level sensor within the tank).

Master control chip 40 outputs signals to output circuits 52 which condition such signals for transmission to the receiver.

Briefly, data transmission board 14 functions as follows. On a routine basis, the receiver sends signals to data transmission board 14 seeking liquid level information from the tank which is associated with encoder-transmitter 10. Because the receiver routinely asks for such information for many tanks, the receiver sends signals identifying the specific tank for which information is being sought. Master control chip 40 receives such signals, via input circuits 46, and compares the tank identification information from address code indicator 44. If this comparison indicates that information is not being sought for the tank associated with transmitter-encoder 10, data transmission board 14 will not respond to the receiver's request.

On the other hand, if this comparison indicates that information is being sought for the tank associated with encoder-transmitter 10, master control chip 140 will send, via output circuit 52, the receiver sequential information, derived from and consistent with the light pattern information received by grid 38, from which the absolute height or level of the liquid in the tank can be determined. Other information, such as temperature information from temperature input card 48, can be supplied by master control chip 40 and output circuits 46 to the receiver upon request. The communications between the receiver and data transmission board 14 are designed to allow information indicating an undesirably high level of liquid in the tank from level alarm indicator 50 to be transmitted via master control chip 40 and output circuits 52 to the receiver at any time when requested by the receiver.

In more detail now and referring to FIGS. 2 through 7, encoder biscuit 12 is as follows. As indicated previously, input shaft 16 is directly linked with first coded disc 24 so that first coded disc 24 rotates in direct response to the rotation of input shaft 16. Input shaft 16 includes gear teeth 54 which mesh with the teeth of gear element 56 which, in turn, surrounds and is attached to short shaft 58. Short shaft 58 extends through top support plate 60 and includes gear teeth 62 which mesh with the teeth of gear element 64. Gear element 64 is concentric with and attached to second coded disc 26. The combination of gear teeth 54, gear element 56, short shaft 58, gear teeth 62 and gear element 64 comprises gear assembly 28, identified above. The combined action of gear assembly 28 causes second coded disc 26 to rotate at a rate of one complete rotation for every ninety six (96) complete rotations of input shaft 16 and first coded disc 24.

Top support plate 60 is attached to middle support plate 66 which is, in turn, attached to bottom support plate 68. These support plates provide the protective structure of encoder biscuit 12. For example, as shown best in FIG. 3, first coded disc 24 is positioned between middle support plate 66 and bottom support plate 68, while second coded disc 26 is positioned between top support plate 60 and middle support plate 66.

First coded disc 24 is further supported by and secured to central plates 70 and 72 which in turn, are secured to input shaft 16. Second coded disc 26 is supported by and attached to both gear element 64 and central plate 74. Of course, top support plate 60, gear element 64, second coded disc 26, and middle support plate 66 are suitably perforated to allow instrument shaft 16 to be directly linked with first coded disc 24.

First light emitter 30 is secured to bottom support plate 68 and first light receiver 34 is secured to middle support plate 34 directly in line with first light emitter 30, as shown in the drawings. In a similar manner, second light emitter 32 is secured to middle support plate 66 and second light receiver 36 is secured to top support plate 60 and is directly in line with second light emitter 32.

Substantially all of the following description of the combination of first light emitter 30 and first light receiver 34 applys with equal weight to the combination of second light emitter 32 and second light receiver 36. First light emitter 30 comprises a linear array of eight (8) commercially available infrared light emitting diodes 76. Lead wire 78 supplys the electrical power to operate diodes 76. First light emitter 30 is secured to bottom support plate 68 so that the linear array of diodes 76 extends generally toward the central axis of first coded disc 24, as best shown in FIG. 5.

First light receiver 34 comprises a linear array of eight commercially available phototransistors 80, each of which are capable of sensing the infrared light emitted by diodes 76. Each phototransistor 80 is associated with a different terminal 82, each of which is connected to a different wire 84. A reference phototransistor 86 associated with terminal 88 and wire 90 is also included in first light receiver 34. First light receiver 34 is secured to middle support plate 66 so that the linear array of phototransistors 80 extends generally toward the central axis of first coded disc 24. First light emitter 30 and first light receiver 34 are positioned so that eight (8) combinations or pairs of one diode 76 and one phototransistor 80 are obtained. This positioning allows the light from any given diode 76 to be received (if at all) by only the phototransistor 80 which is paired with such diode 76.

Lead wire 78 and wires 84 and 90 terminate in a conventional connector 92 which is connected to data transmission board 14.

Briefly, second light emitter 32 includes a linear array of eight (8) commercially available infrared light emitting diodes 94 which are positioned to extend generally toward the central axis of second coded disc 26. Lead wire 96 provides electrical power to diodes 94. Second light receiver 36 includes a linear array of eight (8) commercially available phototransistors 98 which are positioned to extend generally toward the central axis of second coded disc 26. Each phototransistor is associated with a different terminal 100, each of which is connected to a different wire 102. A reference phototransistor 104 associated with terminal 106 and wire 108 is also included in second light receiver 36. Second light emitter 32 and second light receiver 36 are positioned so that eight (8) combinations or pairs of one diode 94 and one phototransistor 98 are obtained. This positioning allows the light from any given diode 94 to be received (if at all) by only the phototransistor 98 which is paired with such diode 94. Lead wire 96 and wires 102 and 108 terminate in a conventional connector 110 which, in turn, is connected to data transmission board 14 to provide proper communication between encoder biscuit 12 and data transmission board 14.

First and second coded discs 24 and 26 will now be discribed in more detail. First coded disc 24 includes specially arrayed groups of opaque areas 112 through which infrared light does not pass, and clear areas 114 through which infrared light does pass. Similarly, second coded disc 26 includes specially arrayed groups of opaque areas 116 and clear areas 118. The configurations of first coded disc 24 and second coded disc 26 with respect to the pattern of opaque and clear areas are identical. Opaque areas 112 and clear areas 114 are positioned on first coded disc 24 in eight (8) concentric, circular arrays. First coded disc 24 is divided into one hundred ninety two (192) radial increments. The pattern of opaque areas 112 and clear areas 114 is such that one and only one of the eight (8) areas in a given radial increment changes from opaque to clear or vice versa relative to the eight (8) areas in either radial increment adjacent to the given radial increment. This "one area change per radial increment" positioning also applys to opaque areas 116 and clear areas 118 on second coded disc 26. The "one area change per radial increment" positioning is beneficial in binary coding the location of each radial increment of first and second coded discs 24 and 26 so that any given radial increment can be identified by a particular light pattern received by first or second light receivers 34 and 36.

The conventional gray code alignment pattern of opaque and clear areas requires two hundred fifty six (256) radial increments to obtain the "one area change per radial increment" effect when, as here, there are eight (8) areas per radial increment. Since both first and second coded discs 24 and 26 include only one hundred ninety two (192) radial increments, a modified gray code has been employed to achieve "one area change per radial increment".

Each of the eight phototransistors 80 of first light receiver 34 is positioned to monitor the presence or absence of infrared light passing through a single, different circular array (of the total of eight (8) concentric, circular arrays available) of opaque-clear areas on first coded disc 24. The information regarding the presence or absence of infrared light at each of the phototransistors 80 is passed to data transmission board 14 for further processing. The collective pattern of such information from phototransistors 80 is indicative of the particular radial increment of first coded disc 24 which is between light emitting diodes 76 and phototransistors 80.

Similarly, each of the eight phototransistors 98 of second light receiver 36 is positioned to monitor the presence or absence of infrared light passing through a single, different circular array of opaque-clear areas on second coded disc 26. This information is passed to data transmission board 14 for further processing. The collective pattern of information from phototransistors 98 is indicative of the particular radial increment of second coded disc 26 which is between light emitting diodes 94 and phototransistors 98.

As noted before both first and second coded discs 24 and 26 are divided into one hundred ninety two (192) radial increments each. Input shaft 16 and first coded disc 24 are calibrated with output shaft 20 so that one complete rotation of input shaft 16 and first coded disc 24 represents one foot (1') of change in the level of liquid in the storage tank equipped with gage 22. Therefore, rotation through each radial increment of first coded disc 24 represents a change of one-sixteenth inch (1/16") in the liquid height or level in the tank. Rotation through each radial increment of second coded disc 26 represents a change of one-half foot ($\frac{1}{2}$') in the level of liquid in the tank. Information indicative of the absolute position of both first and second coded discs 24 and 26 is passed to the receiver by encoder-transmitter 10 so that the receiver can monitor the absolute height or level of liquid in the tank.

In more detail now, and referring to FIGS. 8A and 8B, data transmission board 14 is as follows.

Pin 119 is used to input the electrical power from the field, e.g., ranging from about 35 to about 70 volts D.C., into data transmission board 14. Using conventional regulator 120, the field power is regulated to 30 volts D.C. (Each of the individual components identified in describing FIGS. 8A and 8B are conventional and commercially available.) Thus, the power available in line 122 is 30 volts D.C. This voltage is used in output circuits 52, to energize relay 124, and to supply voltage to regulator 126 which converts it to 5 volts D.C. This 5 volt D.C. power in line 128 is the basic power source for all the integrated circuits (IC's) in the system, to be described hereinafter.

Pin 130 is connected to ground to which all voltage levels are referenced.

Signals from the receiver are input via pin 132. The input is filtered by resistor 134 and capacitor 136 to eliminate any sporadic noise pulses. Diodes 138 and 140 are used to clamp the input signals to the power and ground busses to protect integrated circuit 142.

Integrated circuit 142 is a voltage comparator which is configured to act as a level detector, to detect input voltage swings between 0 and 30 volts, with 5 volts of hysteresis. The output of integrated circuit 142 is inverted and level translated to 5 volts by integrated circuit 144, from which it is input via line 146 to pin 19 of integrated circuit 148.

Integrated circuit 148 is a commercially available LSI CMOS chip, the functioning of which in the present application will be described hereinafter.

Address jumper assembly 150 is used to give encoder-transmitter 10 a unique identification relative to other encoders-transmitters which may be associated with the receiver. The address for encoder-transmitter 10 (and for the storage tank with which it is associated) is selected by removing the appropriate jumpers which add up to the address selected. As shown in FIG. 8A, the address selected for encoder-transmitter 10 is "26". The output from address jumper assembly 150 is input to pins 4 to 10 of integrated circuit 148.

Crystal 152 is an integral part of data transmission board 14 and acts to insure the proper timing relationship between encoder-transmitter 10 and the receiver at all times, independent of environmental influences, e.g., noise. As shown in FIG. 8A, crystal 152 communicates with pins 10 and 11 of integrated circuit 154. Integrated circuit 154 is an oscillator/counter and, together with crystal 152, provides the proper baud rate clock for integrated circuit 148.

The baud rate for data transmission board 14 is jumper selectable at baud rate assembly 156. To change baud rates, all that is necessary is to move the baud rate jumper to the new position desired. The baud rate chosen in FIG. 8A is 300 BAUD.

The input signal from the receiver at pin 19 of integrated circuit 148 consists of eleven (11) bits of information. The first bit is a start bit. This informs integrated circuit 148 that information is being received and starts the input clocking and error detection functions of data transmission board 14. Bits two through eight are data. If bit nine is a high level signal, then bits two through eight are deciphered by integrated circuit 148 as address information. If bit nine is at ground potential, then bits two through eight are interpreted as a command word. Bit 10 is an even parity bit and bit 11 is a single stop bit.

Integrated circuit 148 employs the following error detection techniques to insure that the signal inputed from the receiver is correct. The "parity" test involves adding the data bits and the parity bit and determining whether this sum is even, i.e., bits two through eight plus bit nine. If there is even parity, no parity error is indicated. The "word length" test involves comparing the length of the data word received with that expected and is important to insure that data from the receiver is received and acted upon by integrated circuit 148 in the proper order. The "framing" test involves checking to determine that the proper start and stop bits have been received. It is highly unlikely that a noise pulse will be able to properly simulate the characteristics of the start and stop bits. In any event, if a parity, word length and/or framing error is detected, integrated circuit 148 will ignore the request from the receiver. Corrective action, e.g., resending the input signal, will then be taken.

If an address word from the receiver is input to integrated circuit 148 without a parity, word length or framing error, it is compared to the address input at pins 4 through 10 of integrated circuit 148. If no address match is made, integrated circuit 148 does not respond to any further communication from the receiver. (The encoder-transmitter associated with another tank begins to output information to the receiver.)

However, if an address match is made, integrated circuit 148 will look for a command word from the receiver. If a valid command word is received (meaning that bit nine of the input signal from the receiver is ground potential and then are no parity, framing or word length errors), then the command word is output at pins 39 through 33 of integrated circuit 148. At this point, a positive pulse of approximately one hundred (100) milliseconds duration is output at pin 32 of integrated circuit 148. This resets the timing and control circuit comprising integrated circuits 158, 160, 162, 164 and 166.

Integrated circuit 158 is a 12 bit binary counter. When reset, all output pins, i.e., pins 1, 2, 3, 4, 5, 6, 7, 9, 12, 13, 14 and 15) of integrated circuit 158 go to logic "0". Signals from crystal 152, integrated circuit 154 and baud rate assembly 156 are input through integrated circuit 160 into pin 10 of integrated circuit 158. This starts integrated circuit 158 counting up. Also, the "0" voltage level at pin 1 of integrated circuit 158 is inverted by integrated circuit 166 which causes relay 168 to close. In addition, the low level signal from pin 1 of integrated circuit 156 allows transistor 170 to conduct and provides power to the pull up resistors 172. After sixty four (64) clock pulses, pin 13 of integrated circuit 158 goes to a logic "1" which flips the flip-flop circuit consisting of integrated circuits 162 and 164 which, in turn, triggers integrated circuit 148 to start transmitting.

At clock pulse two thousand forty eight (2048), pin 1 of integrated circuit 158 goes to a logic "1", which resets the flip-flop circuit composed of integrated circuits 162 and 164. This movement to logic "1" also inhibits clock pulses at integrated circuit 166 and Darlington transistor 174, and turns off power to the pull up resistors 172. The movement of pin 1 of integrated circuit 158 to logic "1" and the events resulting therefrom, detailed above, complete the timing events necessary to output the serial data stream requested, and returns encoder-transmitter 10 to the stand-by mode, thus reducing power consumption.

The above-described action of the timing and control circuit takes place each time encoder-transmitter 10 is asked, e.g., by receiver, for information, e.g., light pattern information, alarm and temperature information.

Eight (8) of the pull up resistors 172 are associated with first terminals 176, and the other eight (8) pull up resistors are associated with second terminals 178, as shown in FIG. 8B. First and second terminals may be visualized as being part of grid 38 shown in FIG. 1. In any event, individual wires 84 (from individual phototransistors 80) are attached (via connector 92) to individual first terminals 176. Similarly, individual wires 102 (from individual phototransistors 98) are attached (via connector 110) to individual second terminals 178. Thus, the signals at first and second terminals 176 and 178 (and the signals comprising the serial data stream described above which is to be transmitted by data transmission board 14) are indicative of the radial increment of first and second coded discs 24 and 26 which is between light emitting diodes 76 and phototransistors 80, and light emitting diodes 94 and phototransistors 98, respectively. In other words, the height or level of liquid in the storage tank can be determined by decoding these signals.

The serial data stream is output from pin 21 of integrated circuit 148. This data stream is inverted by integrated circuits 180 and 182 and is further amplified and level shifted by Darlington transistors 184 and 186. This output data stream is routed through relay 188 and pin 190, where it is available to the receiver.

It should be noted that the components immediately to the right of pins 119, 130, 132 and 190 in FIG. 8A comprise lightning protection circuits and act as protection against high voltage transients.

When encoder-transmitter 10 is asked for light pattern information, regulator 192 is configured to output a constant current of approximately five (5) milliamps to each light emitting diode 76 and 94 which are in series. This current is outputted between terminals 194 and 196. The return leg from terminal 196 to ground is switched through Darlington transistor 198 which, in turn, is controlled by integrated circuit 148 (to which it is connected at pin 39). An output command "1" at pin 39 of integrated circuit 148 acts to enable or power up light emitting diodes 76 and 94. By doing this, the information from phototransistors 80 and 98 is forced on the sixteen (16) bit data bus, i.e., pins 22 to 29 and 11 to 18 of integrated circuit 148.

By transmitting a command "2", a high logic level is output on pin 38 of integrated circuit 148. This allows Darlington transistor 200 to conduct enabling opto-isolators 202 and 204. The inputs of opto-isolators 202 and 204 are used as separate alarm inputs to warn of a high liquid level in the storage tank.

External contacts A and B, such as contacts from stationary liquid level sensors at the alarm point in the storage tank (not shown), are input on pins 206 and 208, and pins 210 and 212, respectively. With an external contact closed (indicating an undesirably high level of liquid in the storage tank), current flows through one or both opto-isolators 202 or 204. Such current allows the output at pin 5 of integrated circuit 214 (in the case of Contact A) and/or the output at pin 5 of integrated circuit 216 (in the case of Contact B) to source current to ground, thus inputting a low logic level on pin 11 and/or 12 of integrated circuit 148. In summary, this information, i.e., level alarm information is sent to the receiver by data transmission board 14 in response to the receipt of a command "2".

By transmitting a command "4", a high logic level is output on pin 37 of integrated circuit 148. This allows power to flow through terminal 218 which is associated with an analog/digital converter (not shown) which, in turn, is associated with a temperature sensor (resistance temperature device—RTD) (not shown) in the storage tank. Temperature information is sent back to data transmission board 14 via first and second terminals 176 and 178. As requested, data transmission board 14 transmits such temperature information to the receiver via output circuits 52.

After the receiver obtains the light pattern information from first and second coded discs 24 and 26, in two (2) eleven (11) bit words, it uses its own error detection circuit to insure that it has received valid information from data transmission board 14. The receiver may employ tests similar to the "parity" test the "word length" test and/or the "framing" test described above. In addition, the receiver may employ the "illegal word" error detection test. Since only one hundred ninty two words are legal for level data (from each coded disc), words other than these when received are detected by the receiver and flagged as an "illegal word". The combination of error detection tests used by both the receiver and data transmission board 14 serve to minimize communication errors.

At the receiver, the two words of light pattern information are decoded, using the modified gray code to decimal algorithm, to obtain the absolute height or level, in feet and inches, of the liquid in the storage tank. One additional algorithm is used to allow the receiver to accurately decipher the transition of feet. If the feet information (from second coded disc 26) is even-say 88', rather than odd-say 88.5, and the 16th's information (from first coded disc 24) is greater than 96 16th's, than the actual feet is the feet indicated from first coded disc 24 minus one. A programming line, written in basic, to accomplish this task is as follows:

IF $Q-INT(Q)=0$ and $Q1>96$ then $Q=Q-1$ ELSE $Q=INT(Q)$ wherein
Q=Feet
Q=16th's of an Inch.

While this invention has been described with respect to various specific examples and embodiments, it is to be understood that the invention is not limited thereto and that it can be variously practiced within the scope of the following claims.

The embodiments of the invention in which an exclusive property or privilege is claimed are defined as follows:

1. An apparatus for monitoring the height of liquid in a liquid storage tank, said storage tank being equipped with a height gage including a gage shaft rotatable in response to changes in the height of said liquid in said storage tank, said apparatus comprising:
   instrument shaft means capable of being associated with said gage to rotate in response to the rotation of said gage shaft;
   a first coded disc means associated with said instrument shaft means and rotatable in response to the rotation of said instrument shaft means;
   a second coded disc means associated with said first coded disc means and rotatable in response to the rotation of said first coded disc means;
   first signal emitting means comprising a plurality of distinct first signal sources located relative to said first coded disc means to emit signals through said first coded disc means;
   first signal receiving means comprising a plurality of distinct first signal detectors located relative to said first coded disc means to detect signals from said first signal emitting means which pass through said first coded disc means, said first signal receiving means receiving a different, distinct pattern of signals from said first signal emitting means for each radial increment of said first coded disc means as said first coded disc means rotates;
   second signal emitting means comprising a plurality of distinct second signal sources located relative to said second coded disc means to emit signals through said second coded disc means; and
   second signal receiving means comprising a plurality of distinct second signal detectors located relative to said second coded disc means to detect signals from said second signal emitting means which pass through said second coded disc means, said second signal receiving means receiving a distinct, different pattern of signals from said second signal emitting means for each radial increment of said second coded disc means as said second coded disc means rotates, wherein the patterns of signals received by said first and second signal receiving means are translatable into the absolute height of said liquid in said liquid storage tank over at least a portion of the total height of said tank.

2. The apparatus of claim 1 which further comprises signal processing means associated with said first and second signal receiving means to collect information as to the presence or absence of a signal from each of said distinct first and second signal detectors and to process said information for sequential transmission, as desired.

3. The apparatus of claim 2 wherein said signal processing means is capable of further acting to sequentially transmit said information in response to signals from a receiver means.

4. The apparatus of claim 3 wherein said signal processing means is further capable of receiving alarm information from a level sensor associated with said storage tank indicating an undesirably high level of liquid in said tank, said signal processing means further being capable of transmitting said alarm information to said receiver means.

5. The apparatus of claim 3 wherein said signal processing means is further capable of receiving temperature information from a temperature sensor associated with said storage tank indicating the temperature of said liquid in said tank, said signal processing means further being capable of transmitting said temperature information to said receiver means.

6. The apparatus of claim 3 wherein said signal processing means is further capable of enabling said first and second signal emitting means and said first and second signal receiving means, as desired.

7. The apparatus of claim 1 wherein said patterns of signals are translatable into the absolute height of said liquid in said liquid storage tank over substantially the full working height of said tank.

8. The apparatus of claim 1 wherein said signals are light.

9. The apparatus of claim 1 wherein said signals are infrared light.

10. The apparatus of claim 1 wherein the number of said first signal sources equals the number of said first signal detectors, and the number of said second signal sources equals the number of said second signal detectors.

11. The apparatus of claim 10 wherein said first and second signal sources are light emitting diodes, and said first and second signal detectors are phototransistors.

12. The apparatus of claim 1 wherein said first and second coded disc means include opaque areas which block the transmission of said signals through said first and second disc means and clear areas which allow the transmission of said signals through said first and second disc means.

13. The apparatus of claim 12 wherein said opaque areas and said clear areas are present on both said coded disc means in a series of concentric, curcular arrays such that only one of said areas changes from opaque to clear or from clear to opaque from one radial increment of both said coded disc means to the adjacent radial increment of both said coded disc means.

14. The apparatus of claim 13 wherein said first and second coded disc means have the same configuration of opaque areas and clear areas.

15. The apparatus of claim 13 wherein said first and second signal sources each comprise eight (8) light emitting diodes, said first and second signal receiving sources comprise eight (8) phototransistors, and each of said first and second coded disc means is divided into one hundred ninety two (192) radial increments.

16. The apparatus of claim 1 wherein said first and second coded disc means are continuously rotatable through 360° F. without losing calibration.

* * * * *